(12) United States Patent
Ostermayr et al.

(10) Patent No.: US 7,995,366 B2
(45) Date of Patent: Aug. 9, 2011

(54) HOMOGENOUS CELL ARRAY

(75) Inventors: Martin Ostermayr, Beacon, NY (US);
Ettore Amirante, Nice (FR); Peter Huber, Munich (DE)

(73) Assignee: Infineon Technologies AG, Neubiberg (DE)

( * ) Notice: Subject to any disclaimer, the term of this patent is extended or adjusted under 35 U.S.C. 154(b) by 60 days.

(21) Appl. No.: 12/551,062

(22) Filed: Aug. 31, 2009

(65) Prior Publication Data

US 2011/0049576 A1 Mar. 3, 2011

(51) Int. Cl.
*G11C 11/40* (2006.01)

(52) U.S. Cl. .................. 365/63; 365/94; 365/154

(58) Field of Classification Search .................. 365/104
See application file for complete search history.

(56) References Cited

U.S. PATENT DOCUMENTS

| 7,196,930 B2 * | 3/2007 | Han et al. | 365/185.18 |
| 7,411,822 B2 * | 8/2008 | Specht et al. | 365/185.05 |

* cited by examiner

*Primary Examiner* — Tan T. Nguyen
(74) *Attorney, Agent, or Firm* — Slater & Matsil, L.L.P.

(57) ABSTRACT

A system for terminating a homogenous cell array is disclosed. A preferred embodiment comprises a plurality of homogenous cells arranged in rows and columns to form the homogenous cell array, wherein a first homogenous cell of each column is electrically differently connected than a rest of the homogenous cells of the column.

20 Claims, 8 Drawing Sheets

HOMOGENOUS CELL ARRAY

TECHNICAL FIELD

The present invention relates generally to cell arrays and more particularly to a system for terminating homogenous cell arrays.

BACKGROUND

Microelectronic integrated circuits may be subdivided into macro-blocks and individual cells. Macro-blocks are modules to be used in circuit designs which are standardized and therefore readily available. Macro-blocks are functional circuit blocks such as a central processing unit (CPU), random access memory (RAM), read only memory (ROM), or non-volatile memory (NVM). A cell may be a single circuit element or a group of one or more circuit elements such as transistors, capacitors, and other basic circuit elements grouped to perform a function. A cell may represent a single logical element such as a gate, inverter, or static random access memory (SRAM).

Microelectronic integrated circuits consist of a large number of electronic components that are fabricated by layering several different materials on a silicon substrate. Part of the design of an integrated circuit transforms a circuit description into a geometric description which is known as a layout. A layout comprises a set of planar geometric shapes in several layers.

The cells and other elements of a circuit are interconnected or routed in accordance with the logical design of the circuit to provide the desired functionality. The various elements of the circuit are interconnected by electrically conductive lines that are routed through vertical channels and horizontal channels that run between the elements.

Cells can be arranged in an individual manner or in a homogeneous manner. Cells arranged in a homogenous manner may be a cell array and more specifically a dynamic random access memory (DRAM) or SRAM array, for example. The underlying design principles for organization and arrangement of a homogenous cell array may be different than those of an individually designed logic array.

SUMMARY OF THE INVENTION

In accordance with a preferred embodiment of the present invention, a homogenous cell array is disclosed. The homogenous cell array includes a plurality of homogenous cells arranged in rows and columns to form the homogenous cell array, wherein a first homogenous cell of each column is electrically differently connected than a rest of the homogenous cells of the column.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a homogenous cell array having homogenous termination cells. The invention may also be applied to other homogenous cell arrays such as gate arrays, volatile memory cell arrays or non-volatile memory cell arrays. Embodiments for volatile cell arrays may be SRAM cell arrays or DRAM cell arrays, for example. Embodiments for non-volatile cell arrays may be ROM cell arrays, Flash cell arrays, ferroelectric random access memory (FRAM) cell arrays, magnetoresistive random access memory (MRAM) cell arrays, phase change random access memory (PCRAM) cell arrays, or conductive bridging random access memory (CBRAM) cell arrays, for example.

Figure 1A:
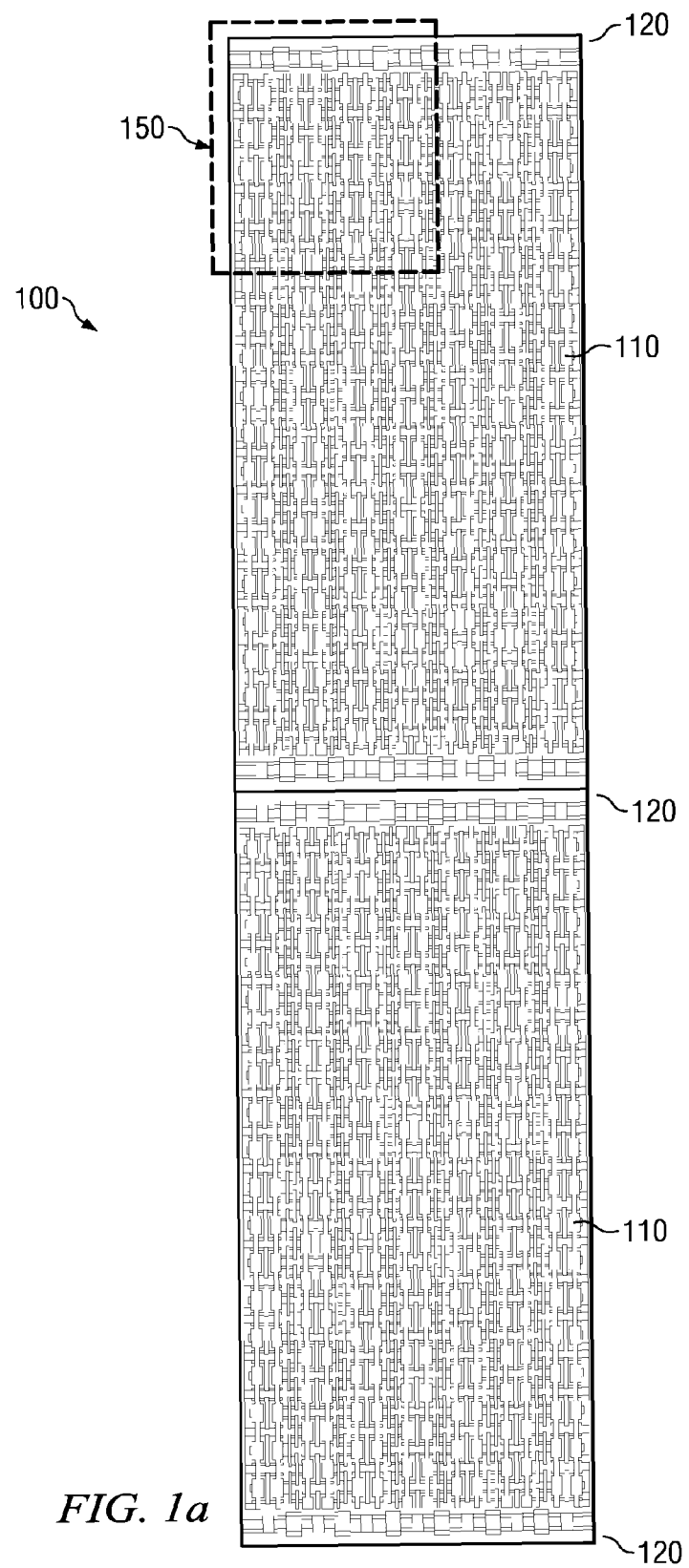
FIG. 1a shows a homogenous cell array.

FIG. 1a shows a portion of an integrated circuit 100 with a typical arrangement of homogenous cell arrays. As can be seen from FIG. 1a, the portion of the integrated circuit 100 is divided into homogenous cell array regions 110 and in strap cell regions 120. The homogenous cell array regions include homogenous cells. The homogenous cell array regions 110 may be interrupted by strap cell regions 120 in order to provide a required minimum potential for all cells in the homogenous cell array region 110. Strap cell regions 120 may be placed at a same distance from each other on a die. Since improvements in process technology allow smaller and smaller cell sizes, a larger number of cells may be placed between the strap cell regions 120. For example, strap cell regions may have been used for every 16 cells for the 130 nm technology node, while strap cell regions may be used for every 128 cells for the 45 nm technology node.

Figure 1B:
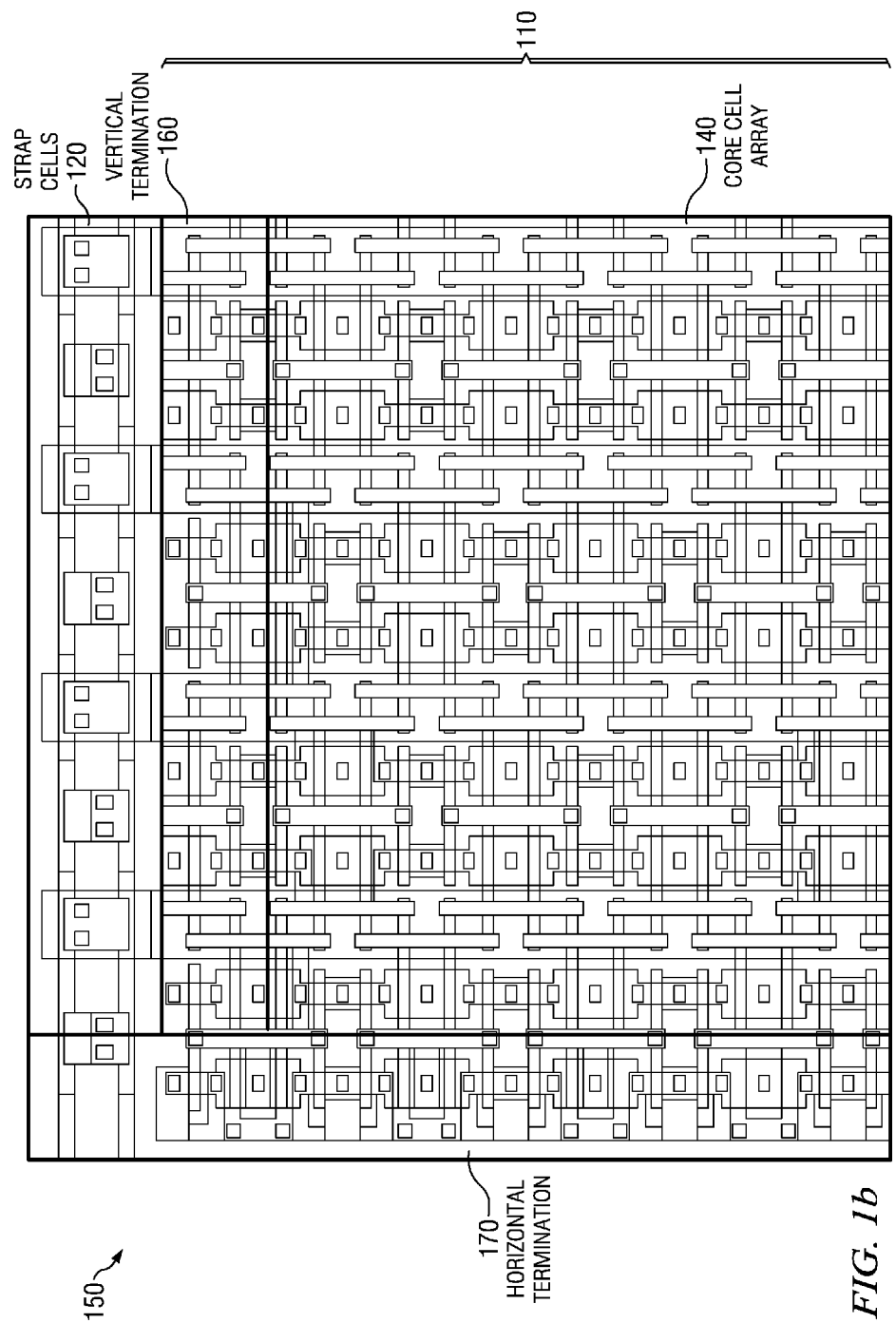
FIG. 1b shows a detail of a homogenous cell array.

FIG. 1b shows a detail of portion 150 of the integrated circuit 100. The detail 150 is taken from the periphery of the homogenous cell array region 110 and from the periphery of the strap cell region 120. As can be seen from FIG. 1b the homogenous cell array region 110 is divided into a homogenous core cell array region 140, a vertical termination region 160 and a horizontal termination region 170. The vertical termination region 160 is arranged between a strap cell region 120 and the homogenous core cell array region 140. A horizontal termination region 170 is arranged adjacent to the homogenous core cell array region 140 in order to terminate the homogenous core cell array region 140 adjacent other logic cells or other homogenous cell arrays.

In conventional homogenous cell arrangements the vertical termination region 160 or the horizontal termination region 170 consists of some type of assist feature structures. These assist feature structures typically include extended active areas and/or poly-silicon lines that are not connected to any electrical potential (floating). Metal interconnect layers such as M1, M2 or higher numbered metal layers are similarly terminated. In conventional arrangements, the assist feature structures have active area/poly-silicon weak points and the metal interconnects may not be sufficiently terminated.

The homogenous core cell array region 140 may be built by homogenously and densely arranged core cells. Termination regions 160 and 170 may be necessary to establish transition areas between highly dense cell areas and regions where cells are not as densely arranged as in the homogenous core cell array region 140. The homogenous core cell array region 140 may advantageously use design rule waivers which are not available for areas where cells are not densely arranged. Transition regions may be necessary to perfect the completion of the homogenous cell array region 110 because of lithographic necessities such as assist feature patterns or optical proximity corrections (OPC).

Cells typically include different types of semiconductor devices such as capacitors, transistors or other basic circuit elements. The cells are grouped together to perform a function. Typical memory cells may be SRAM cells or ROM cells. Typical logic cells may be inverter cells or gate arrays for example. A typical inverter may include a p-channel transistor and an re-channel transistor. Many other cell types are known.

Strap cell regions 120 may include periphery circuitry to establish wells, substrate contacts, and/or power/GND supply contacts for the homogenous core cell array region 140.

Figure 2:
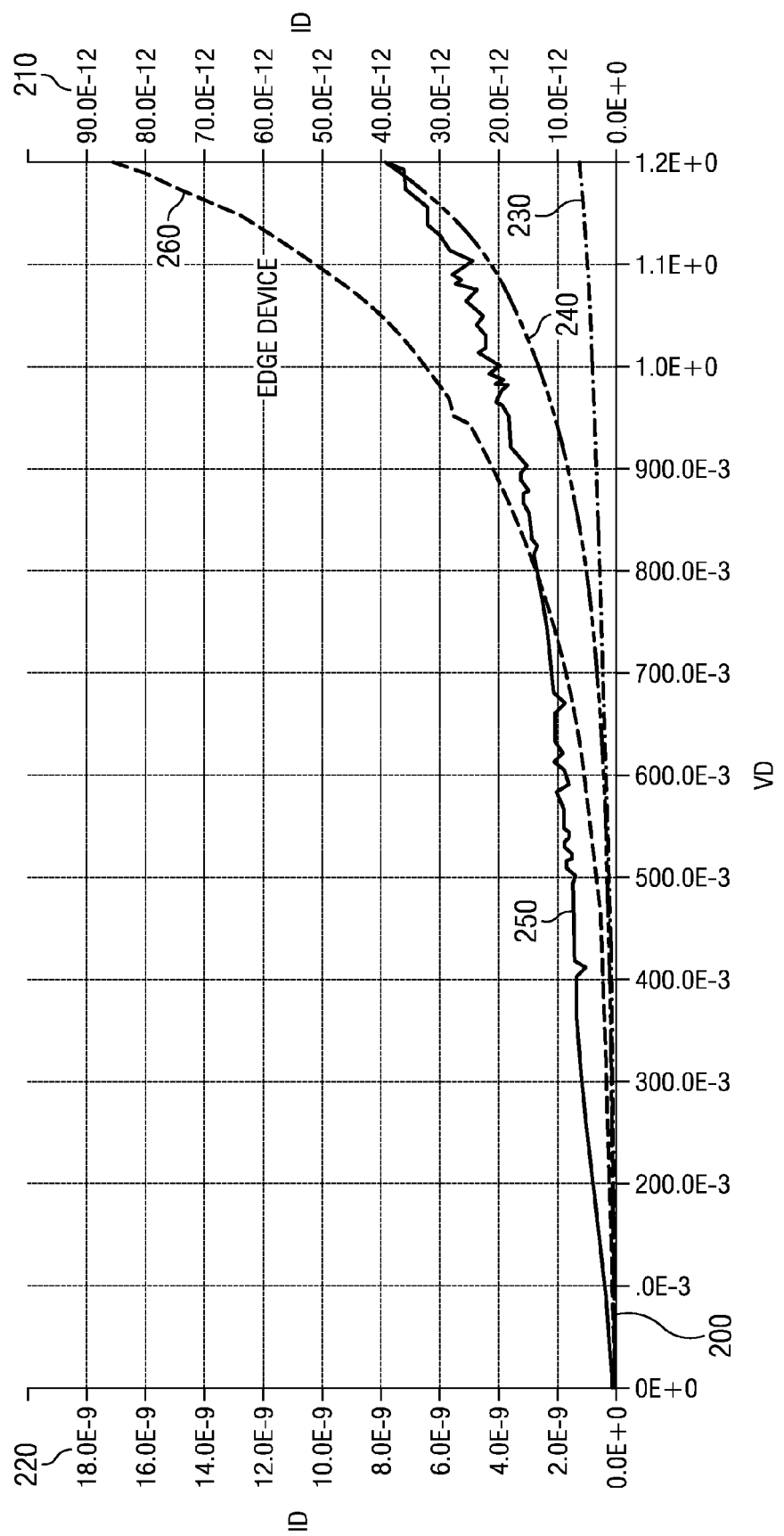
FIG. 2 illustrates a graph of leakage measurements.

FIG. 2 shows a graph of leakage measurements for individual cells of a conventional homogenous cell arrangement. Leakage currents 230-260 have been measured for cells inside the homogenous core cell array region 140 and cells at the periphery of the homogenous core cell array region 140. A scale in volt representing the value of the supply voltage is shown along the x-axis 200. A scale in pico Ampere [pA] is shown on the right y-axis 210 and a scale in nano Ampere [nA] is shown on the left y-axis 220.

Curve 230 reflects a source/drain measurement while curve 250 reflects a drain/source measurement for a cell inside the homogenous core cell array region 140. Curves 230 and 250 show the leakage current in pico Amperes reflected by the right y-axis 210. Curve 240 reflects a source/drain measurement while curve 260 reflects a drain/source measurement for a cell at the periphery of the homogenous core cell array region 140. Curves 240 and 260 show the leakage current in nano Amperes reflected by the left y-axis 220. As can be seen from FIG. 2, the difference in leakage currents between cells inside and cells at the periphery of the homogenous core cell array region 140 in a conventional cell array is about a factor of 1000 for both the source/drain measurement and the drain/source measurement.

These and other problems are generally solved or circumvented, and technical advantages are generally achieved, by preferred embodiments of the present invention. In one embodiment of the present invention, the vertical termination region 160 and the horizontal termination region 170 comprise a plurality of complete core cells. In another embodiment, the vertical termination region 160 and the horizontal termination region 170 comprise only one complete core cell per row and/or per column of core cells. In yet another embodiment, the vertical termination region 160 comprises complete cells and the horizontal termination region 170 comprises fractions of cells.

Figure 3A:
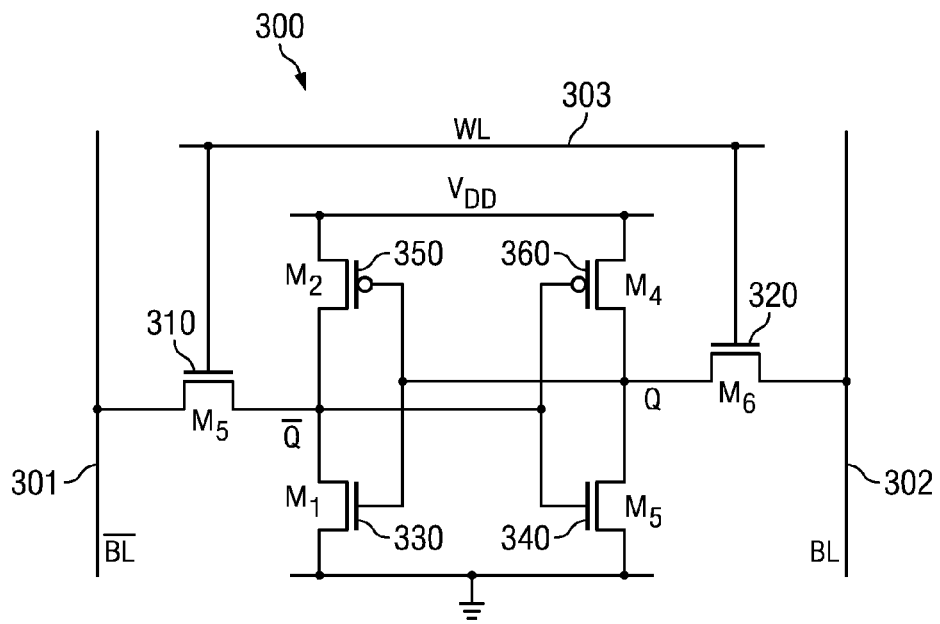
FIG. 3a shows a schematic of a six transistor SRAM cell.

A schematic of a typical six transistor SRAM core cell 300 is shown in FIG. 3a. The SRAM core cell 300 includes a left bit line 301, a right bit line 302 and a word-line 303. The SRAM core cell 300 further includes a pair of pass gate nFETs 310 and 320, a pair of nFETs 330 and 340 and a pair of pFETs 350 and 360.

In a typical six transistor SRAM core cell 300 the sources of the pair of pFETs 350 and 360 are electrically connected to $V_{dd}$. The gates of the pair of pFETs 350 and 360 are electrically connected to the drains of the opposite pFETs 350 and 360. The drain of the pass gate nFET 310 is connected to the drain of the pFET 350 while the source of nFET 310 is electrically connected to the left bit line 301. The drain of the pass gate nFET 320 is connected to the drain of the pFET 360 while the source of the nFET 320 is electrically connected to the right bit line 302. The gate of both pass gate nFETs 310 and 320 are electrically connected to the word-line 303. The gate of nFET 340 is electrically connected to the drain of nFET 310 while the gate of nFET 330 is electrically connected to the drain of nFET 320. The drains of the nFETs 330 and 340 are electrically connected to the drains of the nFETs 310 and 320 on the same side while the sources of the nFETs 330 and 340 are electrically connected to ground or $V_{ss}$.

Figure 3B:
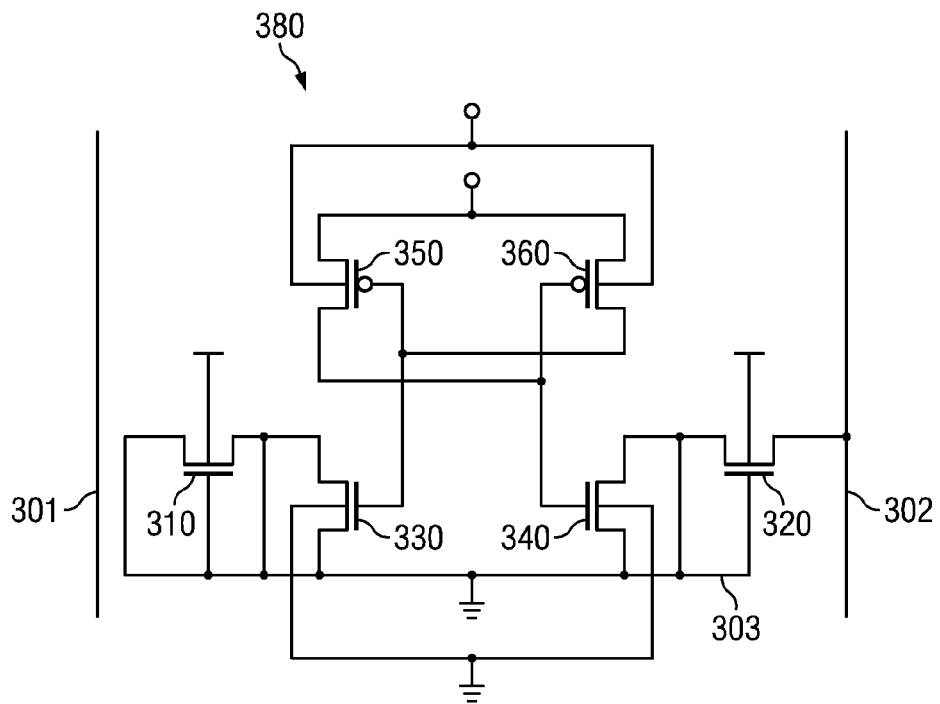
FIG. 3b shows a schematic of an embodiment of a six transistor SRAM cell.

FIG. 3b shows a schematic of an embodiment of an array termination cell. In this embodiment the array termination cell is a six transistor SRAM cell. FIG. 3b shows the same semiconductor devices as are shown in the SRAM device of FIG. 3a. However, the electrical connection of the semiconductor devices is arranged differently.

In this embodiment every node of the termination cell 380 is connected to a specifically defined potential or is forced to remain at a specifically defined potential. None of the nodes is floating and all potentials are fully controlled. The well and the sources of the pFETs 350 and 360 are set to $V_{dd}$ while the well and the sources of the nFETs 310-340 are set to $V_{ss}$ or ground. Further, the source of the pass gate nFET 310 is not electrically connected to the left bit line 301 and the word-line 303 is set to $V_{ss}$ or ground. Setting the word-line 303 to ground closes the pass gates nFETs 310 and 320. The gates of the pFET 360 and the nFET 340 are connected to the drain of the pFET 350 and the gates of the pFET 350 and the nFET 330 are connected to the drain of pFET 360. The left bit line 301 and the right bit line 302 may be set at high or low potential, and the termination cell 380 will not be electrically affected by such a potential arrangement since pass gate nFET 330 is not electrically connected to bit line 301 and pass gate nFET 340 is closed by setting the gate to ground.

Figure 4A:
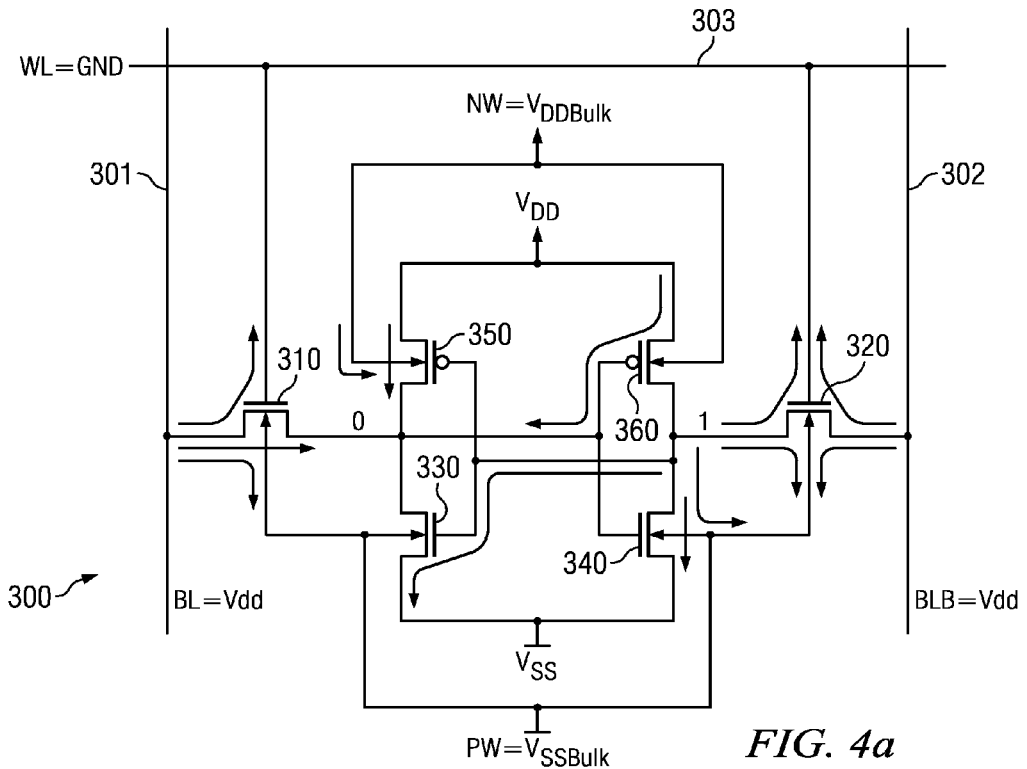
FIG. 4a shows a leakage split up of a cell in a homogenous core cell region.

FIG. 4a shows a leakage split up of a core cell 300. The left bit line 301 and the right bit line 302 are set to $V_{dd}$ and the word-line 303 is set to ground. Leakage current may flow from $V_{dd}$ to $V_{ss}$. Therefore, the leakage current may flow from the left bit line 301 over the pass gate nFET 310 to word-line 303 and from the right bit line 302 over the pass gate nFET 320 to word-line 303. Leakage current may also flow from the pFETs 350 and 360 over the nFETs 330 and 340 to ground or over the pass gate nFETs 310 and 320 to the word-line 303 and hence to ground.

Figure 4B:
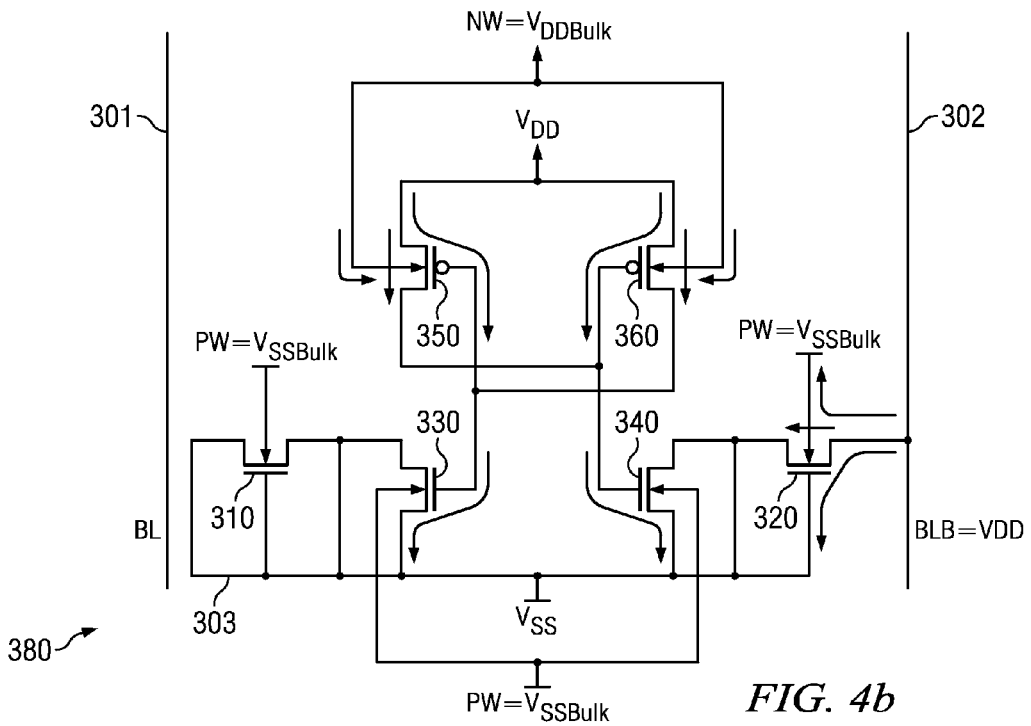
FIG. 4b shows a leakage split up of a cell in a termination region.

In contrast, FIG. 4b shows a leakage split up of an embodiment of an inventive array termination cell 380 in the vertical or horizontal termination region 160 and 170. Leakage current may flow from the bit line 302 to the word-line 303. Leakage current may also flow from the source or the well of the pFETs 350 and 360 through the gates of the nFETs 330 and 340 to ground. Table 1 below shows leakage currents in pico Ampere for the array termination cells versus core array cells for three different simulated temperatures.

TABLE 1

| Temperature in C. | Cell Leakage in [pA] | | |
|---|---|---|---|
| | Termination Cell | Core Cell | Difference in % |
| −40 | 6.1 | 10.3 | −40.78 |
| 25 | 12.7 | 22.4 | −43.3 |
| 110 | 90.9 | 291.2 | −68.78 |

Comparing the inventive array termination cells with conventional cells at the edge of the core cell array region 110 (see FIG. 2) reveals that the array termination cell provides a much better leakage performance than the conventional edge cells. The array termination cells have even a better leakage behavior than the core array cells. In quantifiable terms, the current leakage behavior is about 40%-70% better than the current leakage behavior of the core array cell.

Figure 5:
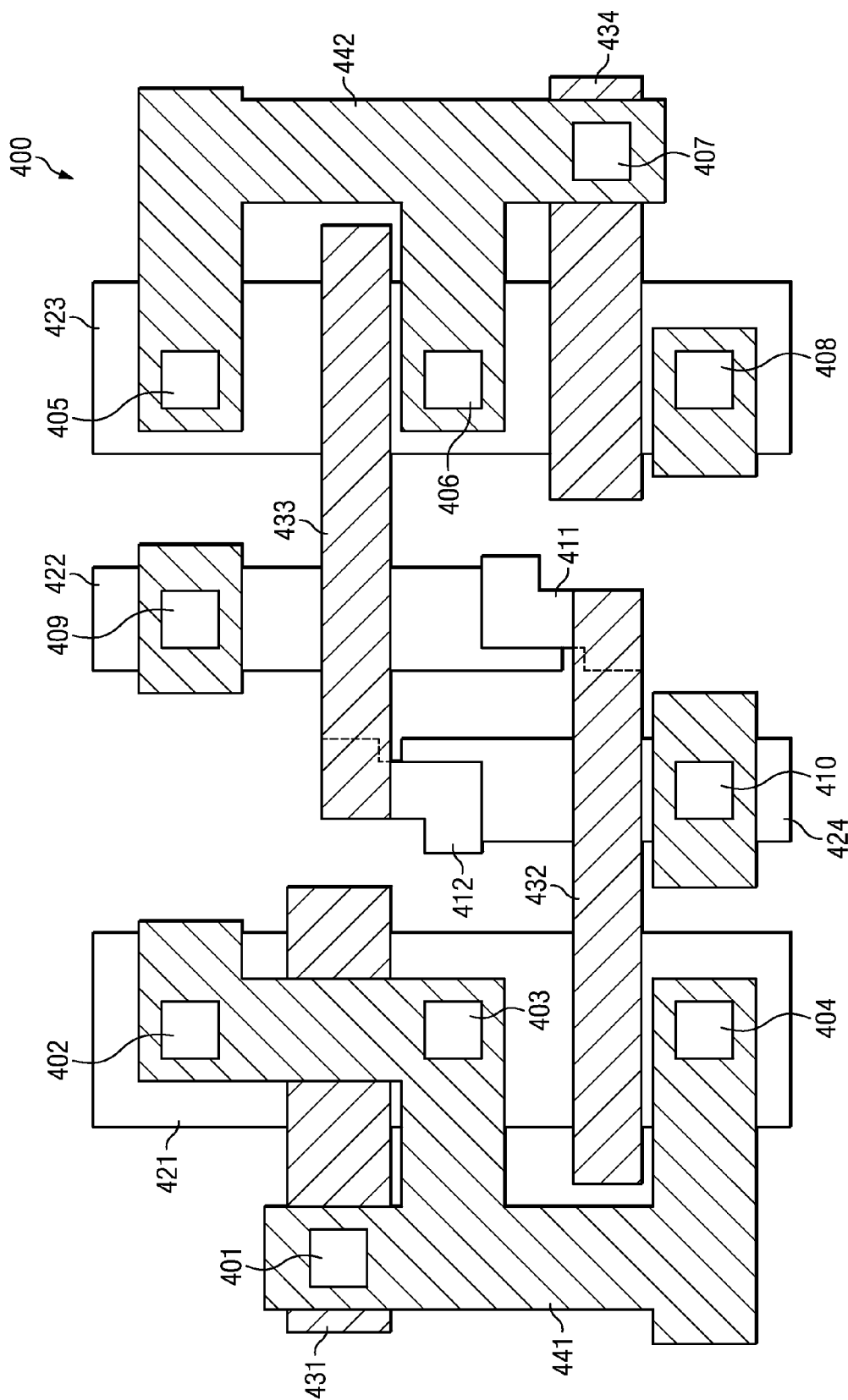
FIG. 5 shows a layout of an embodiment of a cell in a termination region.

FIG. 5 shows a layout of an embodiment of a termination cell 400. Every single terminal or contact of the termination cell 400 is set to a controlled and predetermined potential or is forced to reach a controlled potential. No terminal is floating. In particular, the termination cell 400 may not violate any electrostatic discharge (ESD) rule and is, therefore, ESD error free. In other words, the semiconductor devices in the termination cell 400 are electronically connected so that they are ESD error free.

FIG. 5 illustrates a six transistor SRAM cell as a termination cell. As can be seen from FIG. 5, contacts are numbered 401-412, active areas are numbered 421-424, poly lines are numbered 431-434 and metal lines M1 are numbered 441-442. Contacts 401-404 are electrically connected to each other via interconnect metal M1 441 and set to ground potential. Similarly, contacts 405-407 are electrically connected to each other via interconnect metal M1 442 and also set to ground potential. In contrast, contacts 408, 409 and 410 are set to $V_{dd}$.

In particular, contact 402 is a bit line contact of the pass gate nFET 320 for the right bit line 301 and contact 401 is the gate contact of pass gate nFET 320 to the word-line 303. Contact 404 is the source contact for nFET 340 and set to ground while contact 403 is the contact for the storage node (Q), also set to ground. Contact 410 is the source contact of pFET 320 set to power or to $V_{dd}$. Contact 412 is an elongated contact which connects the drain of pFET 320 with the gate of pFET 310 and the gate of nFET 330. Contact 411 is an elongated contact which connects the drain of pFET 310 with the gate of pFET 320 and the gate of NFET 340. Contact 409 is the source contact of pFET 310 and is set to power or $V_{dd}$. Contact 405 is the source contact of nFET 330 and is set to ground. Contact 406 is the inverse storage node (Q cross) set to ground. Contact 407 is the gate contact of nFET 330 which is set to ground or $V_{ss}$. Contact 408 is the source contact of nFET 330 which is also set to ground.

Figure 6:
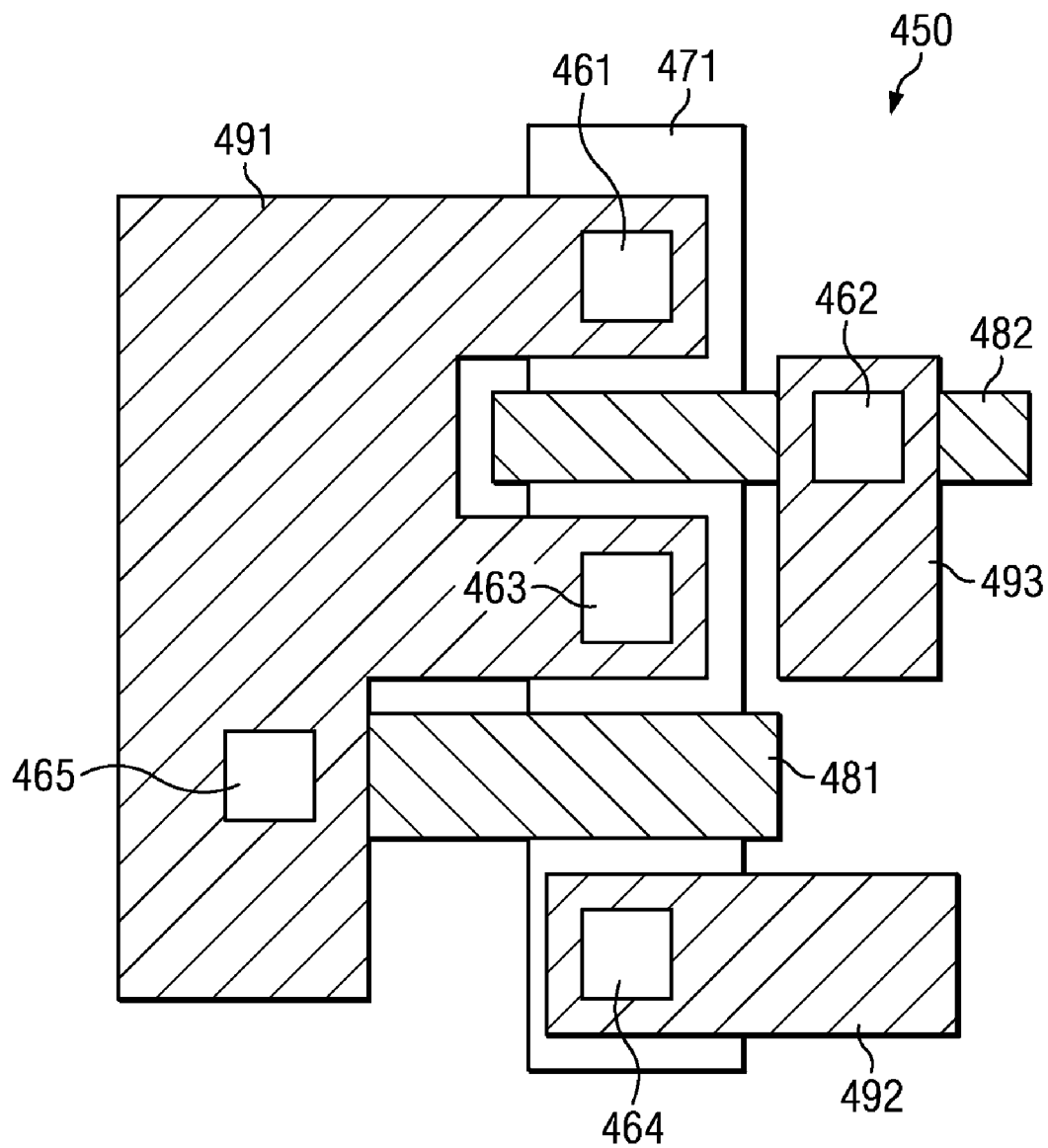
FIG. 6 shows a layout of an embodiment of a cell in a termination region.

FIG. 6 shows a layout of another embodiment of a termination cell 450. However, instead of using a complete cell, here only a fraction of a cell is used to terminate the array. This may be advantageous in order to save chip area. Similarly to FIG. 5, every single terminal of the termination cell 450 is set to a controlled and predetermined potential. No terminal is floating. As can be seen from FIG. 5, contacts are numbered 461-465, the active area is numbered 471, poly lines are numbered 481-482 and metal lines M1 are numbered 491-493. This embodiment of the termination cell 450 may be preferably located in the vertical termination region 170.

The active area 471 is completely terminated and the pitch is kept identical to the pitch of the active area of a core cell. Poly line 482 is a word-line and the word-line is shared with active core cells. Poly line 481 is end terminated. Contacts 461, 463 and 465 are all connected via metal line M1 491 and set to ground or $V_{ss}$. Metal interconnect line M1 492 is shared with the metal line of the active core cell and set to ground.

Contact 461 is the source contact of the pass gate nFET 310 and set to ground. The source contact is not electrically connected to the bit line 301. Contact 462 is the gate contact of the pass gate nFET 310 contacting poly line 482, i.e. the word-line 303. The word-line 303 is shared with the word-line for active cells and therefore comprises high or low voltage settings. Contact 464 is the source contact of nFET 330 and contact 465 is the gate contact of the same transistor. Both contacts are set to ground. Contact 463 is the inverse storage node (Q cross) and set to ground.

Figure 7A:
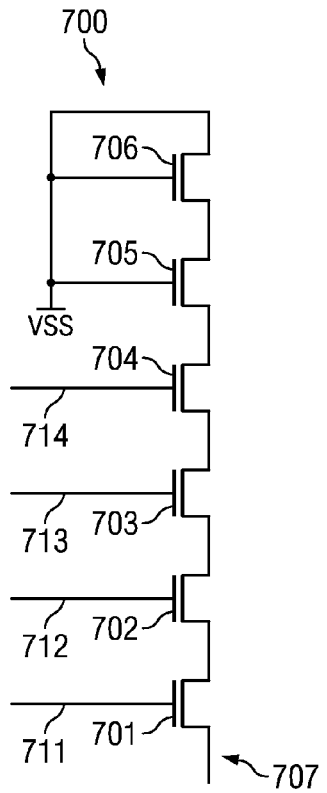
FIGS. 7a-7c show schematics for a ROM cell array.

A schematic of an embodiment of a ROM cell array 700 is shown in FIG. 7a. The ROM cell array comprises four core transistor cells 701-704 and two termination transistor cells 705-706. The core transistor cells share the bit line 707 with the termination transistor cells 705-706. The core transistors of the ROM cell array 700 are serially connected. The source of a core cell transistor 701-704 is connected to the drain of an adjacent core cell transistor 701-704 for each core cell. Each gate of a core cell transistor 701-704 is connected to a word-line 711-714.

In this embodiment, the source of the first termination transistor 705 is connected to the drain of the last core cell transistor 704. The drain of the first termination transistor 705 is connected to the source of the second termination transistor 706 and the drain of the second termination transistor 706 is connected to the gates of the termination transistors and is set to ground or $V_{ss}$.

Figure 7B:
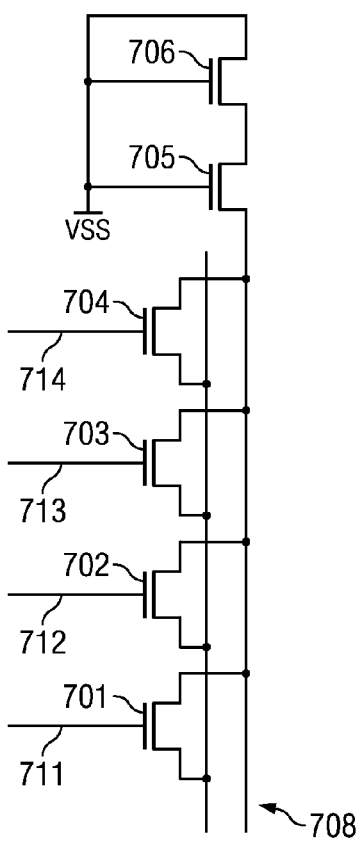
Figure 7C:
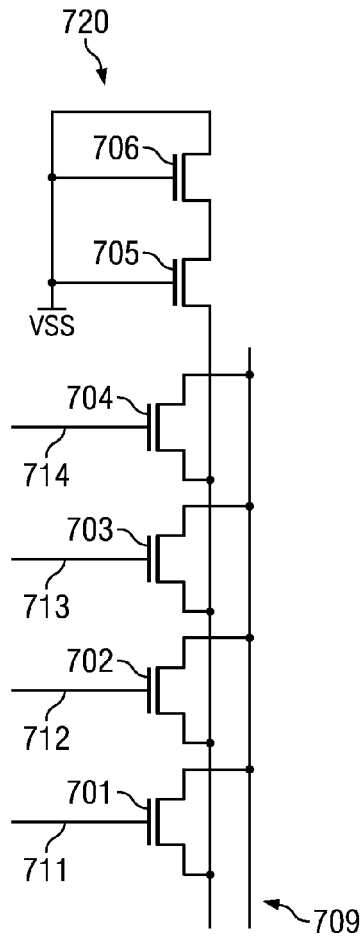

Schematics of further embodiments of ROM cell array 710, 720 are shown in FIGS. 7b-7c. Like numerals have been used for the like elements as in FIG. 7a. The ROM cell arrays comprise four core cell transistors 701-704 and two termination transistor cells 705-706. This time, however, the core cell transistors are connected in parallel. The drains of all core cell transistors 701-704 are connected together and the sources of the core cell transistors are connected together. Therefore, two bit lines may be used per column 708-709. Moreover, in FIG. 7b the drain of the last core cell transistor 704 of the ROM cell array 710 is connected to the source of the first termination transistor 705, while in FIG. 7c the source of the last core cell transistor 704 of the ROM cell array 720 is connected to the source of the first termination transistor 705.

The core cell transistors 701-704 may be programmed by selectively connecting them to metal layer M2 (not shown). For example, a transistor may be programmed as storage state 0 by connecting a via from the transistor to M2. Similarly, the transistor may be programmed as storage state 1 by not connecting the via from the transistor to M2.

Although the present invention and its advantages have been described in detail, it should be understood that various changes, substitutions and alterations can be made herein without departing from the spirit and scope of the invention as defined by the appended claims. For example, it will be readily understood by those skilled in the art that the homogenous cells may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An SRAM cell array comprising:
a plurality of homogenous SRAM cells arranged in rows and columns to form the SRAM cell array, wherein a first homogenous SRAM cell of each column is electrically differently connected than other homogenous SRAM cells of the homogenous SRAM cells of the columns.

2. The SRAM cell array according to claim 1, wherein a last homogenous SRAM cell of each column is electrically different connected than the other homogenous SRAM cells of the homogenous SRAM cells of the columns.

3. The SRAM cell array according to claim 1, wherein first and last cells of each row are termination cells.

4. The SRAM cell array according to claim 1, wherein the homogenous SRAM cell is a six transistor SRAM cell.

5. An integrated circuit comprising:
a first region comprising a first plurality of homogenous cells;
a second region comprising circuitry; and
a third region comprising a second plurality of homogenous cells, the third region arranged between the first region and the second region wherein the first plurality of homogenous cells and the second plurality of homogenous cells comprise a same arrangement of semiconductor devices and wherein the semiconductor devices in the first region are electrically differently connected within the homogenous cells than the semiconductor devices in the third region.

6. The integrated circuit according to claim 5, wherein the semiconductor devices of the third region each comprise a pFET located in a well, and wherein the well of the pFET is set to $V_{dd}$.

7. The integrated circuit according to claim 5, wherein the semiconductor devices of the third region each comprise an nFET located in a well, and wherein the well of the nFET is set to $V_{ss}$.

8. The integrated circuit according to claim 5, wherein the semiconductor devices of the third region each comprise a pFET having a gate and a first and a second source/drain, and wherein the gate of the pFET is set to $V_{dd}$.

9. The integrated circuit according to claim 5, wherein the semiconductor devices of the third region each comprise an nFET having a gate and a first and a second source/drain, and wherein the gate of the nFET is set to $V_{ss}$.

10. The integrated circuit according to claim 5, wherein the semiconductor devices of the third region each comprise a pair of pFETs located in a well and having first and second source/drains, and wherein the well and the first source/drains of the pair of pFETs are set to $V_{dd}$.

11. The integrated circuit according to claim 5, wherein the semiconductor devices of the third region each comprise a pair of nFETs located in a well and having first and second source/drains, and wherein the well and the second source/drains of the pair of nFETs are set to $V_{ss}$.

12. A cell array comprising:
homogenous cells arranged in an n×m matrix array, wherein the homogenous cells comprise same semiconductor devices, wherein the semiconductor devices of a first and a last homogenous cell of each column m are electrically differently connected than the semiconductor devices of other homogenous cells of the n×m matrix array.

13. The cell array according to claim 12, further comprising a first cell and a last cell for each row n, wherein the first and the last cells are termination cells.

14. The cell array according to claim 13, wherein the termination cell is a two transistor cell.

15. The cell array according to claim 12, wherein the homogeneous cell is a six transistor SRAM cell.

16. An SRAM array termination cell, the termination cell comprising:
a pair of P channel field effect transistors (pFETs), each pFET having a gate and a source/drain;
a pair of pass gate N channel field effect transistors (nFETs), each of the pass gate nFETs having a gate and source/drain;
a pair of nFETs, each of the nFETs having a gate and a source/drain;
a pair of complementary bit lines; and
a word-line, wherein the source of the first pass gate nFET is electrically connected to the first bitline, wherein the gate and the drain of the first pass gate nFET and the gate and the source/drain of the second pass gate nFET are electrically connected to the word-line, wherein the source/drains of the pair of the nFETs are electrically connected to the word-line and the word-line is set to $V_{ss}$, wherein the gate of the first nFET is electrically connected to the gate of the first pFET and the drain of the second pFET, wherein the gate of the second nFET is electrically connected to the gate of the second pFET and the drain of the first pFET, and wherein the sources of the pair of pFETs are electrically connected to $V_{dd}$.

17. A method for making a SRAM cell array, comprising:
forming a plurality of homogenous SRAM cells;
electrically connecting the plurality of homogenous SRAM cells to form the SRAM cell array of homogenous SRAM cells comprising rows and columns; and
electrically connecting a first homogenous SRAM cell of each column differently than other homogenous SRAM cells of the column.

18. The method according to claim 17, further electrically connecting a last homogenous SRAM cell of each column differently than the other homogenous SRAM cells of the column.

19. The method according to claim 18, wherein the first and the last homogenous SRAM cell of each column comprise the same electrical connections.

20. The method according to claim 17, wherein the homogenous SRAM cell is a six transistor SRAM cell.

* * * * *